United States Patent
Kim et al.

(10) Patent No.: US 9,384,092 B2
(45) Date of Patent: Jul. 5, 2016

(54) SEMICONDUCTOR MEMORY DEVICE WITH MULTIPLE SUB-MEMORY CELL ARRAYS AND MEMORY SYSTEM INCLUDING SAME

(71) Applicant: SAMSUNG ELECTRONICS CO., LTD., Suwon-si, Gyeonggi-do (KR)

(72) Inventors: Dae Hyun Kim, Hwaseong-si (KR); Seung Jun Bae, Hwaseong-si (KR); Young Soo Sohn, Seoul (KR); Tae Young Oh, Seoul (KR); Won Jin Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 29 days.

(21) Appl. No.: 14/300,289

(22) Filed: Jun. 10, 2014

(65) Prior Publication Data
US 2015/0006994 A1    Jan. 1, 2015

(30) Foreign Application Priority Data
Jun. 26, 2013  (KR) .......................... 10-2013-0074016

(51) Int. Cl.
| G11C 29/42 | (2006.01) |
| G06F 11/10 | (2006.01) |
| G11C 7/08 | (2006.01) |
| G11C 7/06 | (2006.01) |
| G11C 29/54 | (2006.01) |
| G11C 11/4091 | (2006.01) |
| G11C 11/419 | (2006.01) |

(52) U.S. Cl.
CPC ............ G06F 11/1076 (2013.01); G11C 7/065 (2013.01); G11C 7/08 (2013.01); G11C 11/4091 (2013.01); G11C 11/419 (2013.01)

(58) Field of Classification Search
CPC ...... G06F 11/1076; G11C 7/065; G11C 7/08; G11C 11/4091; G11C 11/419
See application file for complete search history.

(56) References Cited

U.S. PATENT DOCUMENTS

| 5,313,425 | A | * | 5/1994 | Lee | .......................... | G11C 29/88 365/201 |
| 5,351,215 | A | * | 9/1994 | Tanabe | .............. | G11C 11/4091 365/190 |
| 5,754,488 | A | * | 5/1998 | Suh | ......................... | G11C 7/062 365/149 |
| 5,875,451 | A | | 2/1999 | Joseph | | |
| 6,643,201 | B2 | | 11/2003 | Lee et al. | | |
| 7,349,282 | B2 | | 3/2008 | Choi et al. | | |
| 7,450,448 | B2 | | 11/2008 | Do | | |
| 7,920,423 | B1 | * | 4/2011 | Ma | .......................... | G11C 16/0433 365/185.04 |
| 8,135,933 | B2 | | 3/2012 | Fisher et al. | | |
| 2003/0007384 | A1 | * | 1/2003 | Shimizu | .................. | G11C 8/12 365/185.03 |
| 2004/0225830 | A1 | | 11/2004 | DeLano | | |

(Continued)

*Primary Examiner* — Cynthia Britt
*Assistant Examiner* — Dipakkumar Gandhi
(74) *Attorney, Agent, or Firm* — Volentine & Whitt, PLLC

(57) ABSTRACT

A semiconductor memory device includes; a memory cell array comprising a first sub-memory cell array storing first data having a first characteristic and a second sub-memory cell array storing second data having a second characteristic different from the first characteristic, a first peripheral circuit operatively associated with only the first sub-memory cell array to execute at least one of a read operation and a write operation directed to a target memory cell of the first sub-memory cell array, and a second peripheral circuit operatively associated with only the second sub-memory cell array to execute at least one of a read operation and a write operation directed to a target memory cell of the second sub-memory cell array.

16 Claims, 13 Drawing Sheets

(56) References Cited

U.S. PATENT DOCUMENTS

| | | |
|---|---|---|
| 2005/0033922 A1 | 2/2005 | Jeddeloh |
| 2006/0005053 A1 | 1/2006 | Jones, Jr. et al. |
| 2007/0076500 A1 | 4/2007 | Im et al. |
| 2010/0157702 A1 | 6/2010 | Seo |
| 2010/0165773 A1* | 7/2010 | Lim ................ G11C 11/40615 365/222 |
| 2011/0197045 A1 | 8/2011 | Okamoto |

* cited by examiner

SEMICONDUCTOR MEMORY DEVICE WITH MULTIPLE SUB-MEMORY CELL ARRAYS AND MEMORY SYSTEM INCLUDING SAME

CROSS-REFERENCE TO RELATED APPLICATIONS

This application claims priority under 35 U.S.C. §119(a) from Korean Patent Application No. 10-2013-0074016 filed on Jun. 26, 2013, the subject matter of which is hereby incorporated by reference.

BACKGROUND

The inventive concept relates generally to semiconductor memory devices and memory systems. More particularly, the inventive concept relates to semiconductor memory devices having different constituent memory cell arrays that are accessed by a processor according to certain data characteristics.

Many contemporary memory systems include an increasing number of semiconductor memory devices. Quite often, different memory types, each type being characterized by respective performance capabilities, are used in memory systems in order to accommodate different data types and data requirements. This increasing complexity notwithstanding, contemporary memory systems must meet ever increasing demands for data access speed and data accuracy. Accordingly, the demands placed upon memory system and memory device designers to provide memory systems capable of providing efficient data access of data having different characteristics remain constant.

SUMMARY

According to certain embodiments of the inventive concept, there is provided a semiconductor memory device comprising; a memory cell array comprising a first sub-memory cell array storing first data having a first characteristic and a second sub-memory cell array storing second data having a second characteristic different from the first characteristic, a first peripheral circuit operatively associated with only the first sub-memory cell array to execute at least one of a read operation and a write operation directed to a target memory cell of the first sub-memory cell array, and a second peripheral circuit operatively associated with only the second sub-memory cell array to execute at least one of a read operation and a write operation directed to a target memory cell of the second sub-memory cell array.

According to certain other embodiments of the inventive concept, there is provided a memory system comprising; a semiconductor memory device and a memory controller configured to control operation of the semiconductor memory device, wherein the semiconductor memory device comprises; a memory cell array comprising a first sub-memory cell array storing first data having a first characteristic and a second sub-memory cell array storing second data having a second characteristic different from the first characteristic, a first peripheral circuit operatively associated with only the first sub-memory cell array to execute at least one of a read operation and a write operation directed to a target memory cell of the first sub-memory cell array, and a second peripheral circuit operatively associated with only the second sub-memory cell array to execute at least one of a read operation and a write operation directed to a target memory cell of the second sub-memory cell array.

BRIEF DESCRIPTION OF THE DRAWINGS

The above and other features and advantages of the inventive concept will become more apparent by describing in detail exemplary embodiments thereof with reference to the attached drawings in which.

DETAILED DESCRIPTION OF EMBODIMENTS

The inventive concept will now be described in some additional detail with reference to the accompanying drawings. This inventive concept may, however, be embodied in many different forms and should not be construed as being limited to only the illustrated embodiments. Rather, these embodiments are provided so that this disclosure will be thorough and complete, and will fully convey the scope of the inventive concept to those skilled in the art. Throughout the written description and drawings, like reference numbers and labels are used to denote like or similar elements and features.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
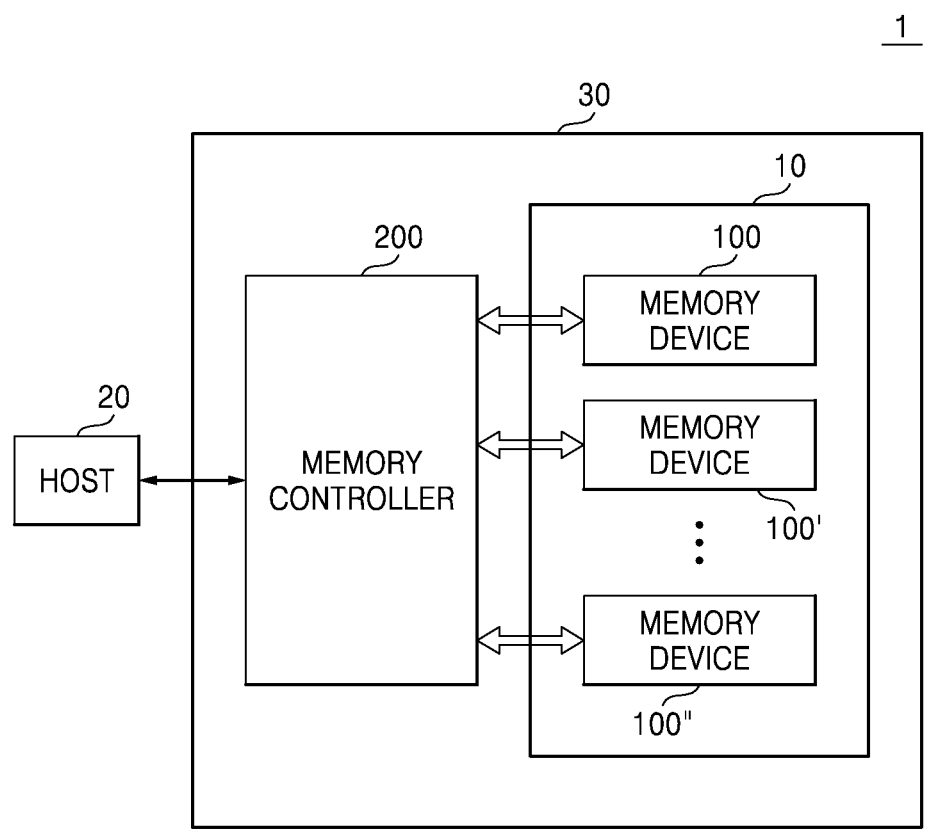
FIG. 1 is a block diagram illustrating an electronic system according to embodiments of the inventive concept.

FIG. 1 is a general block diagram of an electronic system 1 according to certain embodiments of the inventive concept. The electronic system 1 includes a host 20 and a memory system 30, where the memory system 30 includes a memory controller 200 and a memory module 10. Those skilled in the art will appreciate that the electronic system 1 may be implemented within a mobile device, smart phone, notebook, laptop or desktop computer, appliance, television, display, etc.

The host 20 may communicate with the memory system 30 using one or more interface protocol(s), such as the peripheral component interconnect express (PCI-E), advanced technology attachment (ATA), serial ATA (SATA), parallel ATA (PATA), serial attached SCSI (SAS), universal serial bus (USB), multimedia card (MMC), enhanced small disk interface (ESDI), integrated drive electronics (IDE), etc.

The memory controller 200 may be used to control the overall operation of the memory system 30, and in particular the data and information exchanges between the host 20 and memory module 10.

The memory module 10 is assumed to include a number of semiconductor memory devices 100, 100', and 100". For purposes of the description that follows, it is further assumed that the semiconductor memory devices 100, 100', and 100" are Dynamic Random Access Memory (DRAM) including a memory cell array (not shown) configured from a plurality of memory cells arranged in a matrix of rows and columns Of course, others types of semiconductor memory might be used in certain embodiments of the inventive concept in place of, or in addition to the illustrated DRAM.

However, assuming the semiconductor memory devices 100, 100', and 100" are respective DRAM, the memory module 10 may be configured as an un-buffered dual in-line memory module (UDIMM), registered DIMM (RDIMM), load reduced DIMM (LR-DIMM), etc. In certain embodiments, the memory module 10 may further include one or more buffer memor(ies) or register(s) as will be conventionally appreciated.

Figure 2:
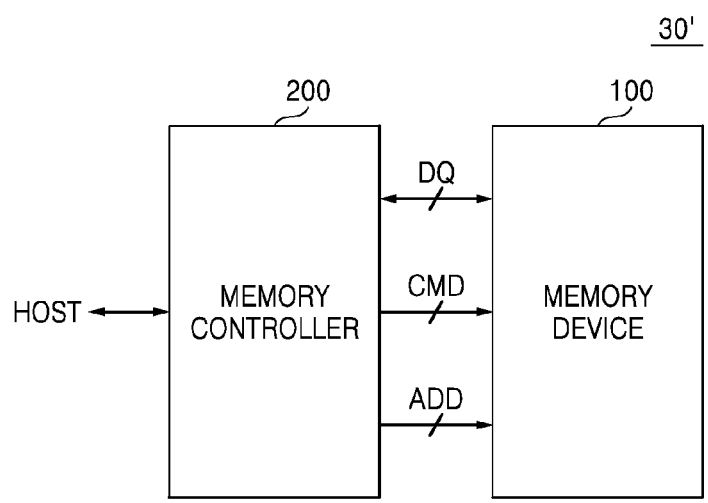
FIG. 2 is a block diagram further illustrating the memory system of FIG. 1.

FIG. 2 is a block diagram further illustrating in one embodiment (30') the memory system 30 of FIG. 1. Here, only a single memory device 100 is illustrated in associated with the memory controller 200 in order to avoid confusing repetition of description. Here, memory controller 200 may provide write data or receive read data (DQ), and provide one or more command(s) (CMD), and/or one or more address(es) (ADD) to the semiconductor memory device 100 using a competent interface protocol. In response to the one or more command(s) provided by the memory controller 200, the memory device 100 will execute one or more operation(s) related to the identified data (DQ) and/or address(es) (ADD) (e.g., a read operation, a write operation, a data refresh operation, etc.).

Figure 3:
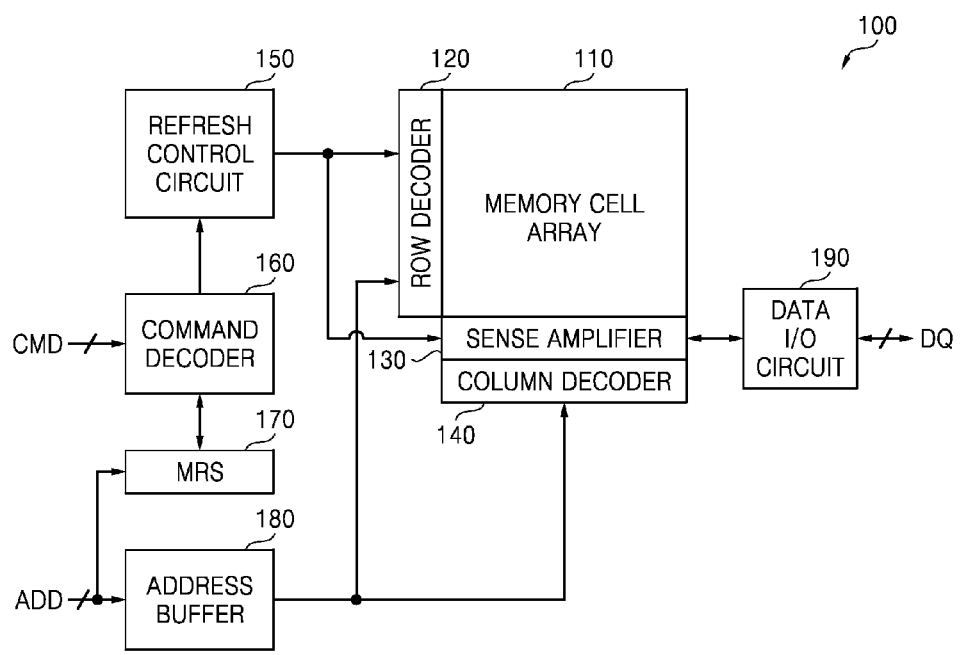
FIG. 3 is a block diagram further illustrating the semiconductor memory device of FIGS. 1 and 2.

FIG. 3 is a block diagram further illustrating the semiconductor memory device 100 of FIGS. 1 and 2 according to certain embodiments of the inventive concept. Referring to FIG. 3, the memory device 100 includes a memory cell array 110, a row decoder 120, a sense amplifier 130, a column decoder 140, a refresh control circuit 150, a command decoder 160, a mode register set/extended mode register set (MRS/EMRS) circuit 170, and address buffer 180, and a data input/output (I/O) circuit 190.

The memory cell array 110 includes a large number of memory cells arranged at the respective intersections of columnar bit lines and row-wise word lines. Consistent with certain embodiments of the inventive concept, the memory cell array 110 include at least two "sub-memory cell arrays", wherein each sub-memory cell array is operationally associated with one or more data types—that is data having one or more designated characteristics. In this regard, each sub-memory cell array may include hetero memory cells having different structures or homo memory cells having the same structure.

The sense amplifier 130 may be used to sense and amplify "read data" retrieved from, or to temporarily store "write data" being written to identified memory cells of the memory cell array 110. Consistent with the foregoing, the sense amplifier 130 will include at least two sense amplifier circuits, each respectively and operationally associated with one of the at least two sub-memory cell arrays. Exemplary structures for the memory cell array 110 and sense amplifier 130 are set forth in relation to FIGS. 4, 5, 6, 7, 8, 9 and 10 (FIGS. 4 through 10) hereafter.

Write data received via the data I/O circuit 190 is written to locations in the memory cell array 110 designated by an associated address (ADD). Read data retrieved from the memory cell array 110 is also identified by an associated address signal (ADD) and is provided to external circuitry, such as the memory controller 200, via the data I/O circuit 190. In this regard, various address(es) received from the memory controller 200 may be temporarily stored in the address buffer 180.

The row decoder 120 may be used to decode a row address portion of an address signal provided by the address buffer 180 in order to select a word line connected to a "target memory cell" to which write data will be written, or from which read data will be read. That is, the row decoder 120 may be used to decode a row address provided by the address buffer 180 and enable a corresponding word line during a read/write operation. The row decoder 120 may also be used to select a word line to be refreshed based on a row address received from the refresh control circuit 150.

In similar manner, the column decoder 140 may be used to decode a column address portion of an address signal received from the address buffer 180 in order to select a bit line connected to the target memory cell.

The command decoder 160 receives the one or more command(s) from the memory controller 200, decodes the command(s), and internally generates one or more decoded command signal(s), such as an active signal, a read signal, a write signal, a refresh signal, etc. The refresh control circuit 150 receives the refresh signal from the command decoder 160 and outputs an internal row address to the row decoder 120 so that the memory cells connected to one or more selected word lines may be refreshed.

The MRS/EMRS circuit 170 may be used to set an internal mode register in response to an MRS command. In this manner, different operating modes (often respectively related to one of a number of different operations) may be operatively defined within the memory device 100.

Although not shown in FIG. 3, those skilled in the art will recognize that the memory device 100 may also include a clock circuit capable of generating one or more clock signal(s), and a voltage generator capable of receiving at least one external power supply voltage and generating a number of internal power supply voltage(s).

Figure 4:
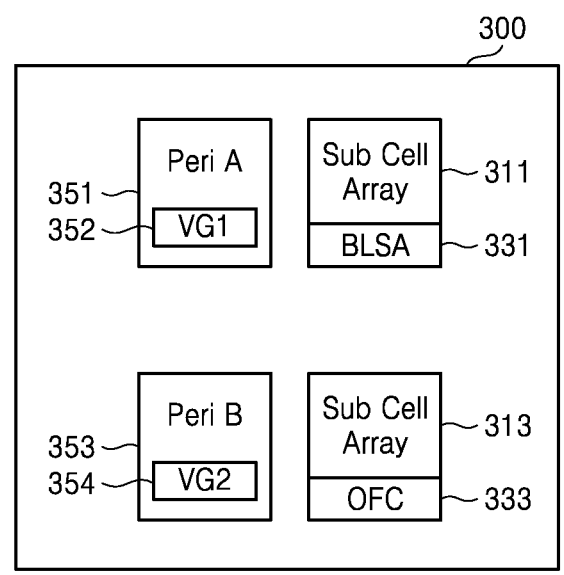
FIGS. 4 and 5 are respective block diagrams further illustrating in various embodiment the semiconductor memory device of FIG. 3.

FIG. 4 is a block diagram further illustrating in one example (300) the memory device 100 of FIGS. 1, 2 and 3. Here, the memory device 300 includes a first sub-memory cell array 311 that is used to store "first data" having a first characteristic, and a second sub-memory cell array 313 that used to store "second data" having a second characteristic different from the first characteristic. Those skilled in the art will understand that many different data "characteristics" may be used, for example, to indicate the relative importance of the corresponding data or the presumed (or verified) reliability of the corresponding data. Other characteristics indicate a particular quantitative nature of the corresponding data, such as random data, consecutive data, data of a certain size, etc. Still other characteristics indicate data properties associated with computational use, such data from a particular source, or data intended for a particular destination, etc. Still other characteristics indicate a particular quality of memory cell chosen to store the identified data, such as access latency, refresh properties, etc.

The memory device 300 also includes a bit line sense amplifier (BLSA) 331 and a first peripheral circuit 351 operatively associated with the first sub-memory cell array 311, as well as an offset cancelling (OFC) BLSA 333 and a second peripheral circuit 353 operatively associated with the second sub-memory cell array 313. Thus, the BLSA 331 may be said to access the first data from the first sub-memory cell array using a first data access approach (or technique), while the OFC BLSA 333 may be said to access the second data from the second sub-memory cell array using a second data access approach different from the first data access approach.

In certain embodiments, the first peripheral circuit 351 comprises a first voltage generator (VG1) 352 and the second peripheral circuit 353 comprises a second voltage generator (VG2) 354, wherein the first and second voltage generators are respectively configured to receive an external power supply voltage and generate different first and second core voltages, respectively applied to the first and second sub-memory cell arrays and their associated first and second sense amplifiers.

In certain embodiments of the inventive concept, each one of the first peripheral circuit 351 and second peripheral circuit 353 may generally include the elements described in relation to FIG. 3 that are used to control the operation of the memory device 100, except for the sense amplifier 130. The first peripheral circuit 351 and second peripheral circuit 353 are separately illustrated in FIG. 4 for clarity of description. However, these circuits may share one or more physical circuits and/or logic blocks.

The first peripheral circuit 351 is used to generate and provide various control signals and/or related voltages necessary to control the operation of the first sub-memory cell array 311 and BLSA 331, while the second peripheral circuit 353 is used to generate and provide various control signals and/or related voltages necessary to control the operation of the second sub-memory cell array 313 and OFC BLSA 333. Thus, the BLSA 331 amplifies a sensed voltage on a selected bit line in order to read data from a target memory cell, while the OFC BLSA 333 amplifies a sensed voltage on a selected bit line while also compensating for an offset voltage between an input terminal and an output terminal in order to read data from a target memory cell. In this manner, the operation of the OFC BLSA 333, as compared with similar operation of the BLSA 331, will reduce overall power consumption by the memory device 300. Further, the operation of particular sense amplifier circuitry (e.g., BLSA 331 verses OFC BLSA 333) may be decided on the basis of one or more characteristic(s) of the data being read, wherein the data having been differentiated according to the one or more characteristics was previously stored in one of the two sub-memory cell arrays using either the first peripheral circuit 351 or second peripheral circuit 353.

Figure 5:
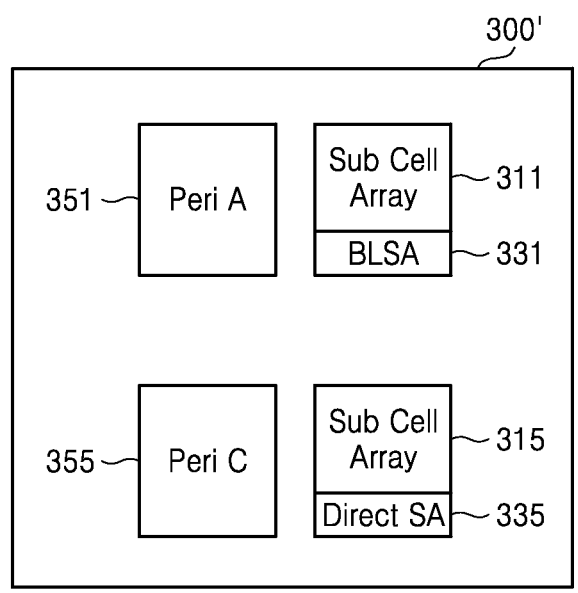

FIG. 5 is a block diagram further illustrating in another example (300') the memory device 100 of FIGS. 1, 2 and 3. The memory device 300' includes the first sub-memory cell array 311 and BLSA 331 associated with the first peripheral circuit 351. However, memory device 300' also includes a third sub-memory cell array 315 that is used to stores data having a third characteristic different from the first characteristic, and a direct sense amplifier (SA) 335, collectively associated with a third peripheral circuit 355 that may be used to particularly control the operation of the third sub-memory cell array 315.

In this context, it is assumed that the direct SA 335 is capable of directly communicating data sensed from a selected bit line directly to a data I/O line. Thus, unlike the BLSA 331 which restores the data read from a target memory cell, the direct SA 335 only reads/write data from/to the target memory cell. Accordingly, data may be read from and written to a target memory cell of the third sub-memory cell array 315 using the direct SA 335 at speeds greater than those provided by the BLSA 331 and the memory cells of the first sub-memory cell array 311.

The semiconductor memory devices 300 and 300' described above in relation to FIGS. 4 and 5 are assumed to differentiate write data according to only a single characteristic (e.g., read operation power consumption (FIG. 4) or read/write speed (FIG. 5)). However, those skilled in the art will recognize that other embodiments of the inventive concept will be capable of differentially writing data to different sub-memory cell arrays or differentially reading data from different sub-memory cell arrays using different types of data access circuitry (e.g., sense amplifiers) in accordance with two or more characteristics. Further, more than two different types of sub-memory cell array and associated access circuitry may be implemented within a single semiconductor memory device.

Figure 6:
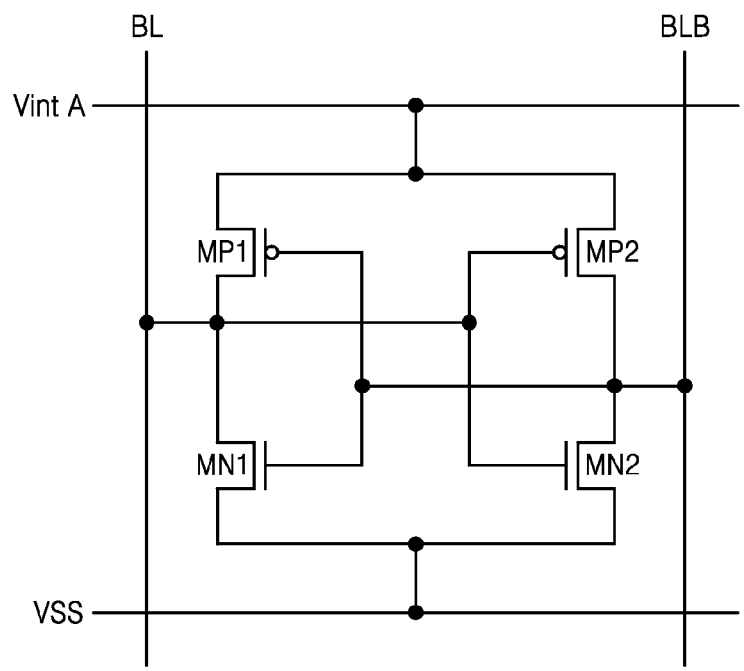
FIG. 6 is a circuit diagram further illustrating the bit line sense amplifier of FIG. 4.

FIG. 6 is a circuit diagram further illustrating in one example (331-1) the BLSA 331 of FIG. 4. The BLSA 331-1 is cross-coupled between a pair of bit lines BL and BLB of the first sub-memory cell array 311, and includes P-channel metal oxide semiconductor (PMOS) transistors MP1 and MP2 connected to a sense amplifier voltage VintA, the bit line BL, and the complementary bit line BLB. The BLSA 331-1 also includes N-channel MOS (NMOS) transistors MN1 and MN2 connected to the bit line BL, the complementary bit line BLB, and a power supply voltage VSS.

Figure 7:
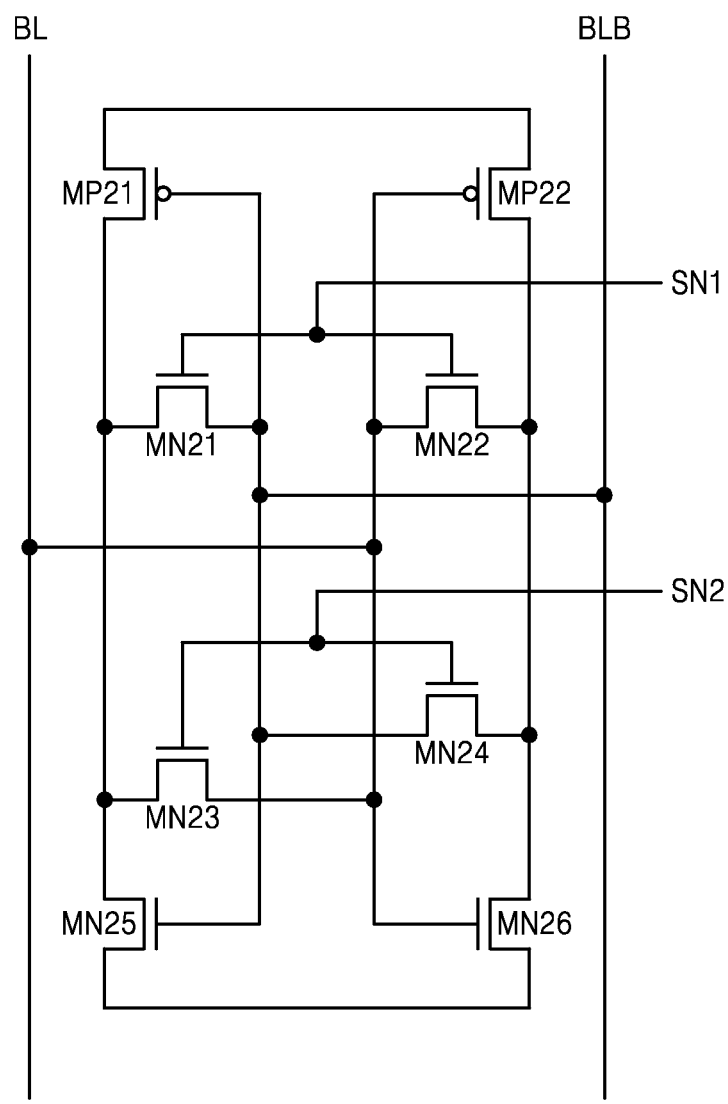
FIG. 7 is a circuit diagram further illustrating the offset cancelling bit line sense amplifier of FIG. 4.

FIG. 7 is a circuit diagram further illustrating in one example (333-1) the OFC BLSA 333 of FIG. 4. The OFC BLSA 333-1 is connected between the bit line BL and the complementary bit line BLB, and includes first and second PMOS transistors MP21 and MP22 and first through sixth NMOS transistors MN21, MN22, MN23, MN24, MN25, and MN26. The OFC BLSA 333-1 amplifies a sensing voltage received from the second sub-memory cell array 313 through the bit line BL and the complementary bit line BLB while compensating for an offset voltage between an input terminal and an output terminal of the OFC BLSA 333-1 in response to a first switching control signal SN1 and a second switching control signal SN2.

Figure 8:
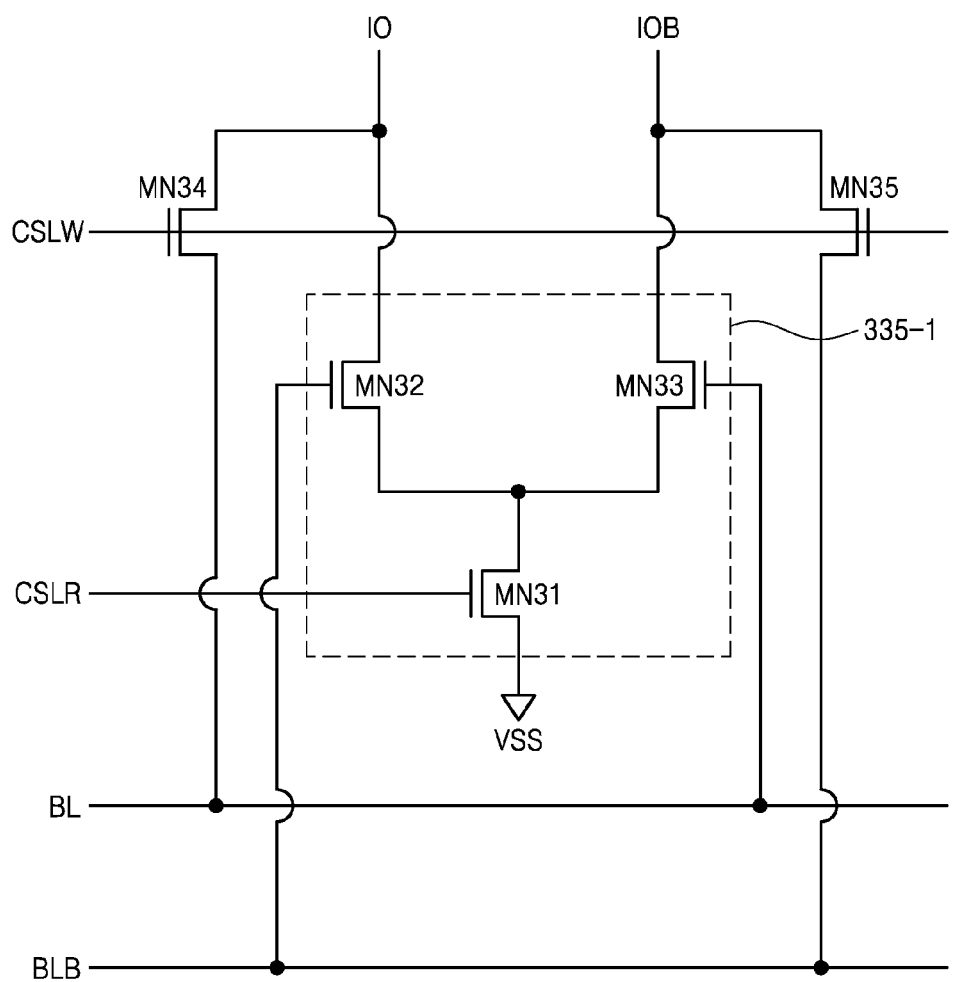
FIG. 8 is a circuit diagram further illustrating the direct sense amplifier of FIG. 5.

FIG. 8 is a circuit diagram further illustrating in one example (335-1) the direct SA 335 of FIG. 5. The direct SA 335-1 corresponding to a single pair of bit lines BL and BLB included in the third sub-memory cell array 315 connects the bit line BL to a second data I/O line IOB through a transistor MN33, and connects complementary bit line BLB to a first data I/O line IO through a transistor MN32. In addition, the bit line BL is connected to the first data I/O line IO through a transistor MN34 and the complementary bit line BLB is connected to the second data I/O line IOB through a transistor MN35.

During a read operation directed to a target memory cell of the third sub-memory cell array 315, a logically "high" read enable signal CSLR is applied to turn ON a transistor MN31 and logically "low" write enable signal CSLW is applied to turn OFF the transistors MN34 and MN35. As a result, data apparent on the bit lines BL and BLB is directly output to the first and second data I/O lines IO and IOB.

During a write operation directed to a target memory cell of the third sub-memory cell array 315, a low read enable signal CSLR is applied to turn OFF the transistor MN31 and a high write enable signal CSLW is applied to turn ON the transistors MN34 and MN35. As a result, data is provided to the pair of the bit lines BL and BLB through the first and second data I/O lines IO and IOB.

Figure 9:
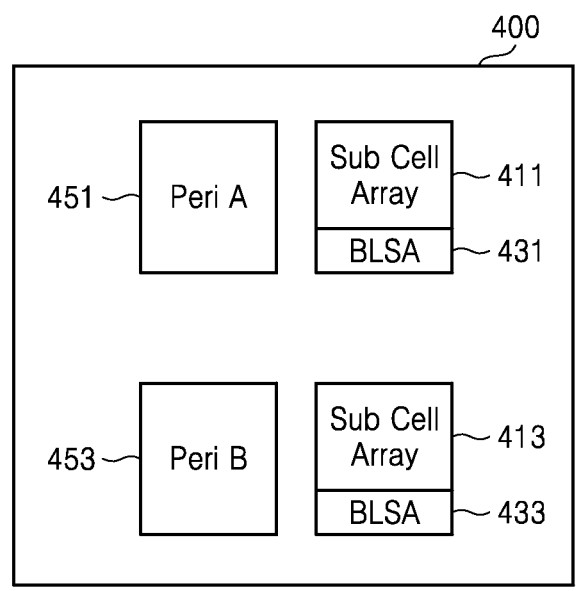
FIG. 9 is a block diagram further illustrating the semiconductor memory device of FIG. 3
Figure 10:
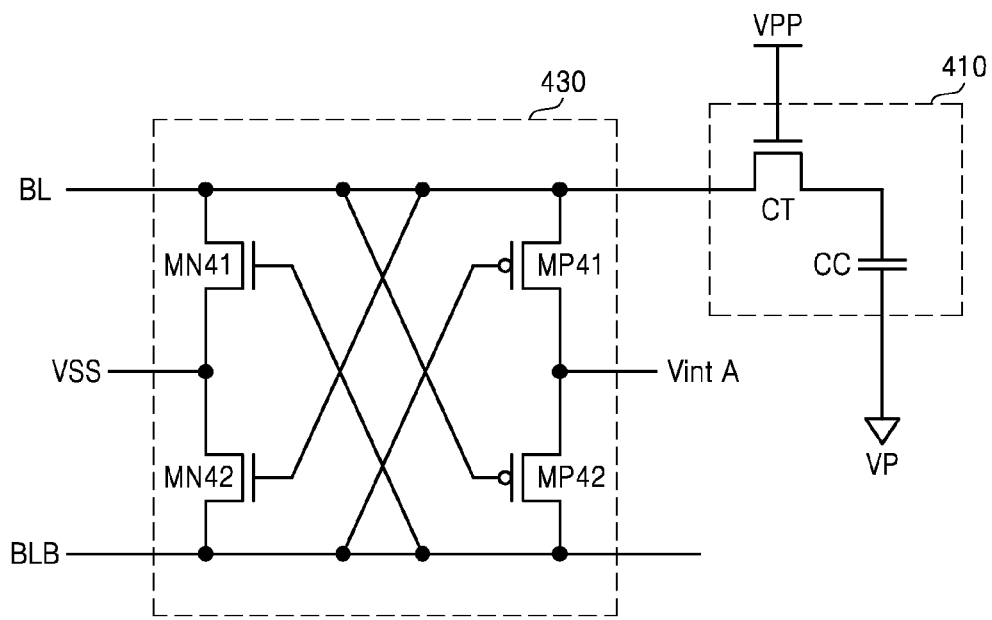
FIG. 10 is a circuit diagram further illustrating a voltage applied to the memory cell array and sense amplifier of FIG. 9.

FIG. 9 is a block diagram further illustrating in another example (400) the memory device 100 of FIGS. 1, 2 and 3. FIG. 10 is a circuit diagram further illustrating how a voltage may be applied to the memory cell array and sense amplifier of FIG. 9. Only single memory cell 410 and a single BLSA 430 corresponding to the memory cell 410 are illustrated in FIG. 10.

The memory device 400 includes first and second sub-memory cell arrays 411 and 413 that are respectively used to store data having given characteristic(s), and first and second BLSAs 431 and 433 that may be respectively used in operative association with the first and second sub-memory cell arrays 411 and 413. The memory device 400 also includes a first peripheral circuit 451 operatively associated with the first sub-memory cell array 411 and the first BLSA 431, and a second peripheral circuit 453 operatively associated with the second sub-memory cell array 413 and the second BLSA 433.

Each of the first and second peripheral circuits 451 and 453 may include a voltage generator (not shown) that receives an external power supply voltage and generates core voltages applied to the sub-memory cell array 411 or 413 and the corresponding BLSA 431 or 433. The voltage generator included in the first peripheral circuit 451 may apply a first core voltage set to the first sub-memory cell array 411 and the first BLSA 431. The voltage generator included in the second peripheral circuit 453 may apply a second core voltage set to the second sub-memory cell array 413 and the second BLSA 433.

The core voltages include a word line voltage VPP, an array power supply voltage VSS, and the sense amplifier voltage VintA, as shown in FIG. 10. The core voltages may include all internal voltages used for the operation of the semiconductor memory device 400.

The voltage generator included in each of the first and second peripheral circuits 451 and 453 generates a different core voltage according to the characteristic of data corresponding to a memory cell based on the control of the memory controller 200, thereby controlling tRCD.

Figure 11:
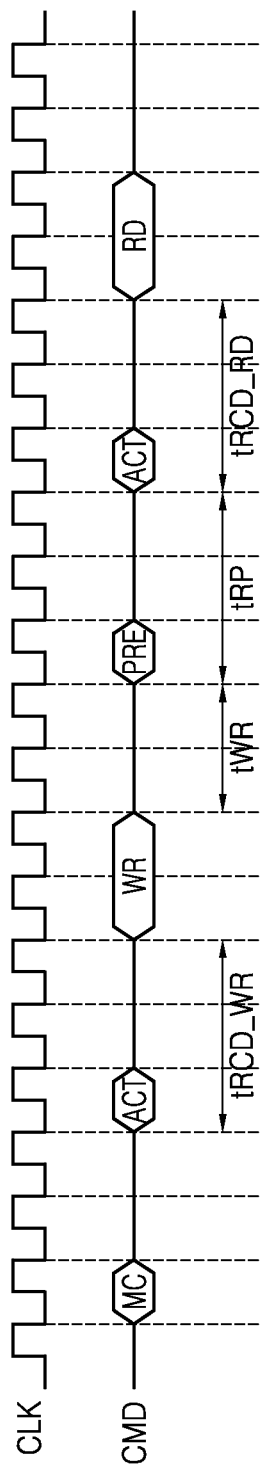
FIG. 11 is a timing chart explaining a method of controlling an AC parameter using any one of the sense amplifiers illustrated in FIGS. 4 through 10.

FIG. 11 is a timing chart illustrating one method of controlling an AC parameter using any one of the various sense amplifiers described in relation to FIGS. 4 through 10.

When an MRS command (MC) is received from the memory controller 200, the MRS/EMRS circuit 170 sets at least one internal mode register in the memory device 100. Thereafter, an active command (ACT) is applied to activate a selected word line, and then a write command (WR) is applied to perform a write operation.

After a selected bit line is activated in response to the write command (WR), a precharge command (PRE) is applied to perform a precharge operation. Thereafter, the active command (ACT) is applied to activate the selected word line, and then a read command (RD) is applied to perform a read operation.

The period between application of the active command (ACT) and application of the write command (WR) may be referred to as "tRCD_WR". The period between completion of the write operation and application of the precharge command (PRE) may be referred to as "tWR". The period between application of the precharge command (PRE) and application of the active command (ACT) may be referred to as "tRP", and the period between application of the active command (ACT) and application of the read command (RD) may be referred to as "tRCD_RD".

In these context, the timing of certain "AC parameters" such as tRCD_WR, tWR, tRP, and tRCD_RD may be particularly controlled by the memory devices 300, 300', and 400. For instance, the clock cycle of tRCD_WR and tRCD_RD and the clock cycle of tWR may be reduced by increasing the word line voltage VPP, as illustrated in FIG. 10. The clock cycle of tRCD_WR and tRCD_RD may be reduced while the clock cycle of tWR may be extended by increasing the sense amplifier voltage VintA.

Certain AC parameters understood by those skilled in the art, such as tRCD_WR, tWR, tRP, and tRCD_RD described above, have been defined in a standardized manner by the Joint Electron Device Engineering Council (JEDEC). Related publications may be obtained from JEDEC describing such parameters. However, in addition to certain standardized AC parameters, application of system performance specific AC parameters for each one of a number of sub-memory cell arrays may be defined in various embodiments of the inventive concept.

Figure 12:
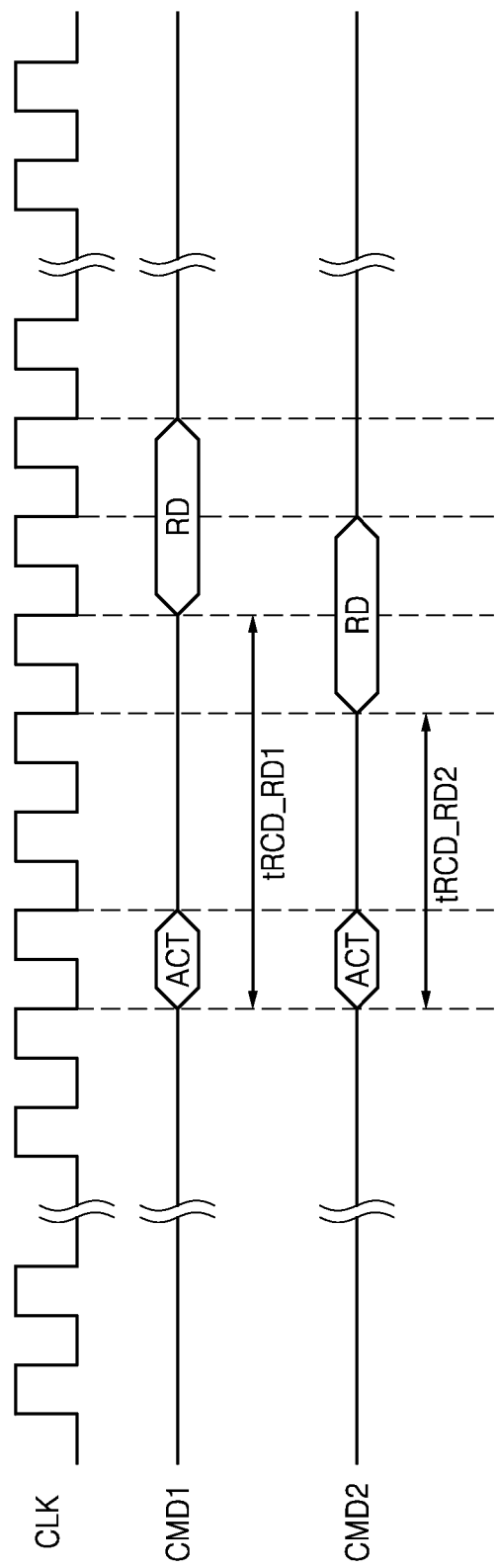
FIG. 12 is a timing chart explaining operation of any one of the sense amplifiers illustrated in FIGS. 4 through 10.

FIG. 12 is a timing chart illustrating operation of a sense amplifier like the ones described in relation to FIGS. 4 through 10 according to certain embodiments of the inventive concept. A case is assumed wherein a first command CMD1 and a second command CMD2 are provided by the memory controller 200.

Referring to FIG. 12, tRCD_RD1, i.e., tRCD corresponding to the first command CMD1 is longer than tRCD_RD2, i.e., tRCD corresponding to the second command CMD2 in the read operation of the semiconductor memory device. The first command CMD1 may correspond to the first sub-memory cell array 311 and the BLSA 331 and the second command CMD2 may correspond to the third sub-memory cell array 315 and the direct SA 335.

As described above, the direct SA 335 performs only the read or write operation of data corresponding to a memory cell, and therefore, the memory cells included in the third sub-memory cell array 315 may have more improved tRCD than the memory cells included in the first sub-memory cell array 311. In other words, data stored in the memory cells of the third sub-memory cell array 315 may be read out faster than data stored in the memory cells of the first sub-memory cell array 311.

Figure 13:
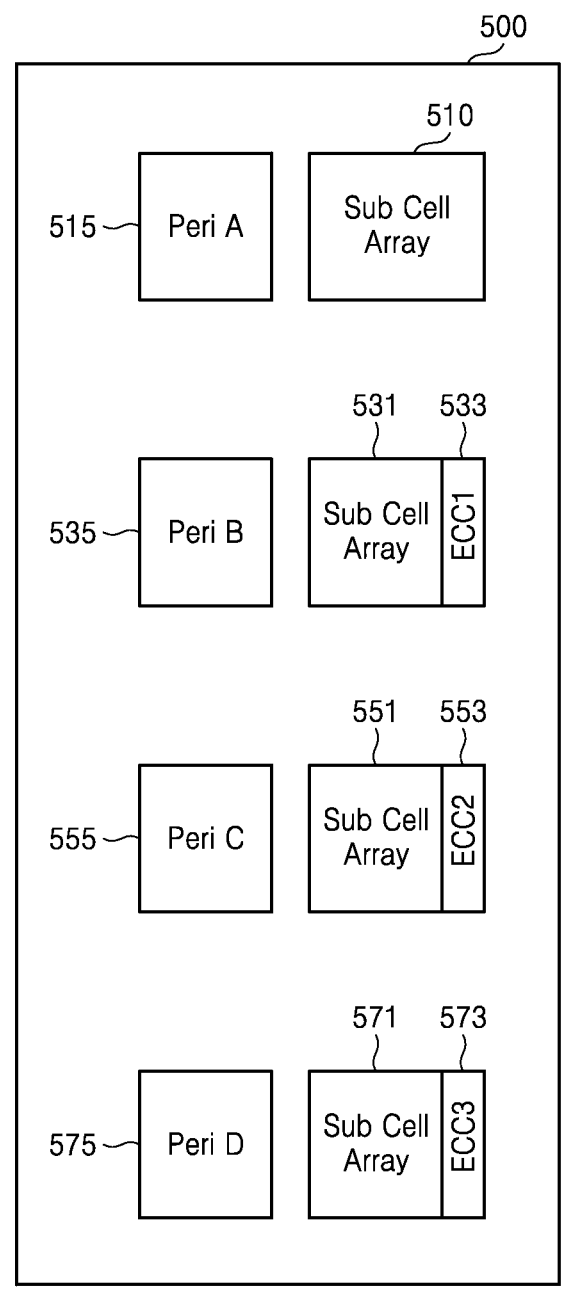
FIG. 13 is a block diagram illustrating in another embodiment the semiconductor memory device of FIG. 3.

FIG. 13 is a block diagram further illustrating in another example (500) the semiconductor memory device 100 of FIGS. 1, 2 and 3. The memory device 500 may selectively include an error correction code (ECC) block as operatively associated with each one of a number of sub-memory cell arrays 510, 531, 551, and 571. The semiconductor memory device 500 also includes peripheral circuits 515, 535, 555, and 575 respectively corresponding to the sub-memory cell arrays 510, 531, 551, and 571.

Based on one or more data characteristic(s), data that does not need application of an ECC function may be stored in the first sub-memory cell array 510, while other data variously requiring one of several different ECC functions may be stored in the second through fourth sub-memory cell arrays 531, 551, and 571. The memory controller 200 provide externally provided write data to one of the first through fourth sub-memory cell arrays 510, 531, 551, and 571 according to the one or more data characteristic(s). In order to accomplished this select data writing functionality, the memory controller 200 may detect and store the configuration of the semiconductor memory device 500 upon memory system power-up.

As shown in FIG. 13, the second through fourth sub-memory cell arrays 531, 551, and 571 respectively include first through third ECC blocks 533, 553, and 573 which may include memory cells designated to store "parity data" corresponding to (e.g., derived from) "normal data" stored in the second through fourth sub-memory cell arrays 531, 551, and 571. Here, each of the second through fourth peripheral circuits 535, 555, and 575 may include an ECC engine that performs error detection and/or correction on the normal read/write data based on the parity data stored in the ECC block 533, 553, or 573. Conventionally understood ECC engines include, as examples, those that use a Hamming code, a Bose-Chaudhuri-Hocquenghen (BCH) code, or a Reed-Solomon (RS) code. However, the ECC circuitry incorporated by various embodiments of the invention concept is not restricted to these examples.

Thus, when data requires a fast operation, the memory controller 200 may control the semiconductor memory device 500 to store the data in the first sub-memory cell array 510. In addition, when data is one that is frequently accessed, the memory controller 200 may control the semiconductor memory device 500 to store the data in one of the second through fourth sub-memory cell arrays 531, 551, and 571. Accordingly, memory cells in the first sub-memory cell array 510 may have a higher refresh frequency than memory cells in the second through fourth sub-memory cell arrays 531, 551, and 571. It follows that when the semiconductor memory device 100 is differently configured and differently operated in view of one or more data characteristic(s) for the data being stored, overall memory system performance increases.

As described above, according to certain embodiments of the inventive concept, a semiconductor memory device includes multiple sub-memory cell arrays, each being used to store data having different characteristic(s) to thereby increase memory system performance while potentially decreasing power consumption. It should be noted that a constituent "unitary" memory cell array (i.e., a physically bounded matrix of memory cells) may be logically divided into two or more sub-memory cell arrays, where each sub-memory cell array is thereafter functionally operated in a manner consistent with one or more different data characteristics. Alternately or additionally, physically separate sub-memory cell arrays may be provided in a single semiconductor memory device. Similarly, it should be noted that physically separate first and second peripheral circuits may be operatively associated with two or more sub-memory cell arrays. Alternately, the first and second peripheral circuits may share one or more resources (e.g., register, memory, voltage generator, clock circuitry, power supply, etc.).

While the inventive concept has been particularly shown and described with reference to exemplary embodiments thereof, it will be understood by those of ordinary skill in the art that various changes in forms and details may be made therein without departing from the scope of the inventive concept as defined by the following claims.

What is claimed is:

1. A semiconductor memory device comprising a dynamic random access memory (DRAM) and including:
   a memory cell array comprising a first sub-memory cell array storing first data having a first characteristic and a second sub-memory cell array storing second data having a second characteristic different from the first characteristic;
   a first peripheral circuit operatively associated with only the first sub-memory cell array to execute at least one of a read operation and a write operation directed to a target memory cell of the first sub-memory cell array;
   a second peripheral circuit operatively associated with only the second sub-memory cell array to execute at least one of a read operation and a write operation directed to a target memory cell of the second sub-memory cell array;
   a first sense amplifier accessing the first data stored in the first sub-memory cell array during the read operation using a first data access approach; and
   a second sense amplifier accessing the second data stored in the second sub-memory cell array during the read operation using a second data access approach different from the first data access approach;
   wherein each of the first and second peripheral circuits to control a timing of AC parameter corresponding to the first and second sub-memory cell array by controlling core voltages applied to the first and second sub-memory cell arrays and the corresponding first and second sense amplifiers.

2. The semiconductor memory device of claim 1, wherein each one of the first and second characteristics indicates one of relative importance of the corresponding data, reliability of the corresponding data, and type of the corresponding data.

3. The semiconductor memory device of claim 1, wherein the first sense amplifier is differently configured from the second sense amplifier.

4. The semiconductor memory device of claim 3, wherein the first sense amplifier is a bit line sense amplifier (BLSA), and the second sense amplifier is one of an offset cancelling BLSA and a direct bit line sense amplifier.

5. The semiconductor memory device of claim 3, wherein the first peripheral circuit comprises a first voltage generator configured to receive an external power supply voltage and generate a first core voltage applied to the first sub-memory cell array; and
   the second peripheral circuit comprises a second voltage generator configured to receive the external power supply voltage and generate a second core voltage different from the first core voltage and applied to the second sub-memory cell array.

6. The semiconductor memory device of claim 5, wherein each of the first and second core voltages is a word line voltage.

7. The semiconductor memory device of claim 1, wherein the second data comprises normal data and parity data derived from the normal data, and the semiconductor memory device further comprises an error correction code (ECC) block operatively associated with only the second sub-memory cell array and operating in relation to the second data.

8. The semiconductor memory device of claim 7, wherein the second peripheral circuit comprises an ECC engine configured to perform error correction on the normal data using the parity data, and the ECC engine performs the error correction using a code selected from a group of codes comprising a Hamming code, a Bose-Chaudhuri-Hocquenghen (BCH) code, and a Reed-Solomon (RS) code.

9. A memory system comprising:
a semiconductor memory device, comprising a dynamic random access memory (DRAM), and a memory controller configured to control operation of the semiconductor memory device,
wherein the semiconductor memory device comprises:
a memory cell array comprising a first sub-memory cell array storing first data having a first characteristic and a second sub-memory cell array storing second data having a second characteristic different from the first characteristic;
a first peripheral circuit operatively associated with only the first sub-memory cell array to execute at least one of a read operation and a write operation directed to a target memory cell of the first sub-memory cell array;
a second peripheral circuit operatively associated with only the second sub-memory cell array to execute at least one of a read operation and a write operation directed to a target memory cell of the second sub-memory cell array;
a first sense amplifier accessing the first data stored in the first sub-memory cell array during the read operation using a first data access approach; and
a second sense amplifier accessing the second data stored in the second sub-memory cell array during the read operation using a second data access approach different from the first data access approach;
wherein each of the first and second peripheral circuits is configured to control a timing of an AC parameter corresponding to the first and second sub-memory cell arrays by controlling core voltages applied to the first and second sub-memory cell arrays and the corresponding the first and second sense amplifiers.

10. The memory system of claim 9, wherein each one of the first and second characteristics indicates one of relative importance of the corresponding data, reliability of the corresponding data, and type of the corresponding data.

11. The memory system of claim 9, wherein the first sense amplifier is differently configured from the second sense amplifier.

12. The memory system of claim 11, wherein the first sense amplifier is a bit line sense amplifier (BLSA), and the second sense amplifier is one of an offset cancelling BLSA and a direct bit line sense amplifier.

13. The memory system of claim 12, wherein the first peripheral circuit comprises a first voltage generator configured to receive an external power supply voltage and generate a first core voltage applied to the first sub-memory cell array; and the second peripheral circuit comprises a second voltage generator configured to receive the external power supply voltage and generate a second core voltage different from the first core voltage and applied to the second sub-memory cell array.

14. The memory system of claim 13, wherein each of the first and second core voltages is a word line voltage.

15. The memory system of claim 9, wherein the second data comprises normal data and parity data derived from the normal data, and the semiconductor memory device further comprises an error correction code (ECC) block operatively associated with only the second sub-memory cell array and operating in relation to the second data.

16. The memory system of claim 15, wherein the second peripheral circuit comprises an ECC engine configured to perform error correction on the normal data using the parity data, and the ECC engine performs the error correction using a code selected from a group of codes comprising a Hamming code, a Bose-Chaudhuri-Hocquenghen (BCH) code, and a Reed-Solomon (RS) code.

* * * * *